United States Patent [19]
Kudoh

[11] Patent Number: 5,332,960
[45] Date of Patent: Jul. 26, 1994

[54] POWER SUPPLY CIRCUIT HAVING RESET CIRCUIT

[75] Inventor: Kazuhiro Kudoh, Tokyo, Japan

[73] Assignee: NEC Corporation, Tokyo, Japan

[21] Appl. No.: 100,187

[22] Filed: Aug. 2, 1993

Related U.S. Application Data

[63] Continuation of Ser. No. 647,344, Jan. 29, 1991, abandoned.

[30] Foreign Application Priority Data

Jan. 30, 1990 [JP] Japan ................. 2-20330

[51] Int. Cl.⁵ ............................................. G05F 5/00
[52] U.S. Cl. ...................... 323/299; 323/303; 323/901
[58] Field of Search ............ 323/303, 901, 299; 363/49; G05F 5/00

[56] References Cited

U.S. PATENT DOCUMENTS

| | | | |
|---|---|---|---|
| 4,340,851 | 7/1982 | Nishikawa | 323/901 |
| 4,410,936 | 10/1983 | Suzuki | 363/21 |
| 4,473,759 | 9/1984 | Mahabadi | 307/350 |
| 4,574,232 | 3/1986 | Petty | 323/901 |
| 4,617,509 | 10/1986 | Tomisawa | 323/303 |
| 4,716,521 | 12/1987 | Nagae | 364/200 |

FOREIGN PATENT DOCUMENTS

| | | |
|---|---|---|
| 0025194 | 9/1981 | European Pat. Off. |
| 0132133 | 1/1985 | European Pat. Off. |
| 0300440 | 1/1989 | European Pat. Off. |
| 1246616 | 12/1989 | Japan |

*Primary Examiner*—R. Skudy
*Assistant Examiner*—Adolf Berhand
*Attorney, Agent, or Firm*—Leydig, Voit & Mayer

[57] ABSTRACT

A power supply circuit includes a power supply stabilizing circuit, a reset circuit, and a switching circuit. The power supply stabilizing circuit stabilizes a power supply voltage from a power supply and applying the voltage to a main circuit. The reset circuit outputs a reset signal to the main circuit when the power supply voltage rises. The switching circuit is connected to the power supply stabilizing circuit. The switching circuit stops supply of power to the reset circuit when the voltage applied to the main circuit becomes a value not more than a predetermined value after supply of power is interrupted.

12 Claims, 3 Drawing Sheets

POWER SUPPLY CIRCUIT HAVING RESET CIRCUIT

This application is a continuation of application Ser. No. 07/647,344, filed Jan. 29, 1991 now abandoned.

BACKGROUND OF THE INVENTION

The present invention relates to an arrangement of a circuit for resetting an internal state of a main circuit at the rise time of a power supply voltage.

A conventional power supply circuit having a reset circuit of this type has an arrangement shown in, e.g., FIG. 4. A reset circuit 2 is connected to an integrated circuit (IC) 1 as a main circuit. A voltage from a battery 3 is stored in a capacitor C1 so as to supply a stable power supply voltage to the IC 1.

When a switch S is closed, the reset circuit 2 receives a power supply voltage and supplies a reset signal to the IC 1, thus resetting the internal state thereof. FIGS. 5 and 6 show changes in voltage applied to the IC 1 when the switch S is opened and closed.

FIG. 5 shows changes in terminal voltage when the switch S is closed. More specifically, when the switch S is closed, and a DC voltage $V_{CC}$ is applied from the battery 3 to the IC 1 and the reset circuit 2 at time $t=0$, the voltage of a power supply input terminal 4 of the IC 1 substantially reaches $V_{CC}$ at $t=0$, provided that the capacitance of the input terminal 4 is negligibly small, as indicated by a curve 4a in FIG. 5.

Assume that a sufficient period of time has elapsed at time $t<0$ after the switch S is opened, charges in the capacitor C1 and a capacitor C2 are discharged through resistors R1 and R2, and no charges are left in the capacitor C2. In this case, when the switch S is closed, a voltage is applied to a reset input terminal 5 in accordance with a time constant determined by the resistor R1 and the capacitor C2, as indicated by a curve 5a in FIG. 5. Providing that the resistor R1 has a resistance $r_1$ ($\Omega$) and the capacitor C2 has a capacitance $c_2$ (F), a time constant $\tau_1$ is given by $\tau_1 = r_1 \cdot c_2$ (S). Referring to FIG. 4, reference numeral 6 denotes a GND terminal.

If the switch S is closed, and a power supply voltage is applied to the IC 1 in this manner, the voltage $V_{cc}$ is applied to the power supply voltage input terminal 4 when time t is close to 0. At the same time, a voltage close to 0 V is applied to the reset input terminal 5, and the voltage of the reset input terminal 5 reaches $V_{cc}$ with the lapse of time. Subsequently, the internal state of the IC 1 is reset to 0 V, i.e., "Low" logic level. More specifically, the IC 1 is reset by a reset signal having a voltage close to 0 V, which is applied to the reset input terminal 5. The reset state of the IC 1 is canceled when the voltage of the reset input terminal 5 is increased after the reset operation.

FIG. 6 shows changes in terminal voltages when the switch S is opened. When the switch S is opened ($t = t_a$), and no power supply voltage is applied to the IC 1, the voltage of the reset input terminal 5 is decreased as indicated by a curve 5b in FIG. 6, provided that the capacitor C1 can be neglected, as indicated by the following equation:

$$\text{time constant } \tau_2 = (r_1 + r_2)c_2 \text{ [S]}$$

$$(R_2 = r_2 \text{ [}\Omega\text{]})$$

In practice, however, a capacitor having a large capacitance is generally used as the capacitor C1 in order to stabilize a power supply voltage, and hence $c_1 < c_2$ is established. If, therefore, the current consumption of the IC 1 is small, the voltage of the reset input terminal 5 exhibits changes indicated by a curve 5c in FIG. 6, due to the following time constant as a dominant factor:

$$\text{time constant } \tau_3 = r_2 \cdot c_1 \text{ [S]}$$

$$(C1 = c_1 \text{ [F]})$$

Note that a portable radio transceiver does not have the switch S, and the reset circuit 2 is operated upon mounting and dismounting of the battery 3.

The following problem is posed in the above-described reset circuit 2. When the switch S is opened and is subsequently closed again before the voltage of the reset input terminal 5 is sufficiently decreased, the IC 1 cannot be reset in spite of the fact that the power supply voltage applied to the IC 1 is decreased once.

In order to solve such a problem, the time constant $\tau_2$ needs to be made small, and $r_2$ and $c_1$ need to be made small to minimize the time constant $\tau_3$ if the current consumption of the IC 1 is small. However, the capacitance $c_1$ of the capacitor C1 needs to be relatively large to stabilize a power supply voltage and hence cannot be set to be small. In addition, if the resistor R2 ($r_2$) is made small, a current corresponding to the decrease in $r_2$ undesirably flows constantly.

Since a decrease in the time constant $\tau_3$ is limited in this manner, it is difficult to prevent variations in power supply voltage in a decreased state, which are caused upon, e.g., quick switching of power supplies, from influencing a reset operation.

SUMMARY OF THE INVENTION

The present invention has been made in consideration of the problem described above, and has as its object to provide a power supply circuit having a reset circuit, which can reliably perform a reset operation of a main circuit by eliminating the influences of variations in power supply voltage in a decreased state.

In order to achieve the above object, according to the invention, a power supply circuit includes a power supply stabilizing circuit receiving a power supply voltage from a power supply. The power supply stabilizing circuit stabilizes the power supply voltage. A main circuit is connected in parallel with the power supply stabilizing circuit and receives the power supply voltage without a substantial voltage drop. A reset circuit outputs a reset signal to the main circuit when the power supply voltage rises. A reset circuit control receives the power supply voltage and interrupts supply of power from the power supply to the rest circuit when the power supply voltage applied to the main circuit decreases to a value not more than a predetermined value after supply of power is interrupted.

According to the above-described arrangement, when supply of power is interrupted upon, e.g., switching, a voltage applied from the power supply stabilizing circuit, e.g., a capacitor, is decreased in accordance with a predetermined time constant. When the voltage becomes a predetermined value or less, supply of power to the reset circuit is stopped by the switching circuit. Therefore, the voltage at the output terminal of the reset circuit is quickly decreased to 0 V regardless of the power supply stabilizing circuit, and a resettable state can be immediately ensured.

DESCRIPTION OF THE PREFERRED EMBODIMENT

An embodiment of the present invention will be described below with reference to the accompanying drawings.

Figure 1:
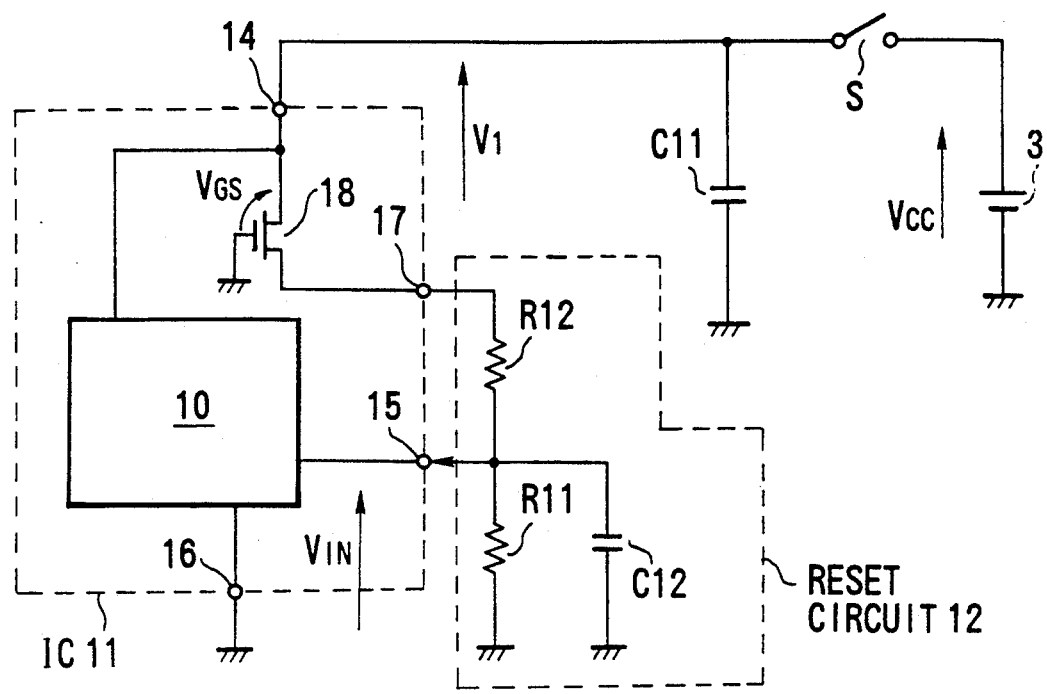
FIG. 1 is a circuit diagram showing a power supply circuit having a reset circuit according to an embodiment of the present invention.

FIG. 1 shows a power supply circuit having a reset circuit according to the embodiment. A p-channel MOSFET (metal oxide semiconductor field effect transistor) 18 as a switching circuit (reset circuit control means) is incorporated in an integrated circuit (IC) 11 having a main circuit 10. When a switch S is closed, a power supply voltage $V_{CC}$ from a battery 3 is applied to a power supply voltage input terminal 14. A capacitor C11 serves as a power supply stabilizing circuit for stabilizing a power supply voltage, and has a relatively large capacitance $c_{11}$. One terminal of the capacitor C11 is connected to the power supply voltage input terminal 14 of the IC 11.

An output terminal 17 of the IC 11 serves as a power supply voltage output terminal with respect to a reset circuit 12, and the gate of the FET 18 is grounded. With this arrangement, when the voltage $V_{CC}$ is applied to the power supply input terminal 14, a gate-source voltage $V_{GS}$ exceeds a threshold value $V_{TH}$, and the FET 18 is rendered conductive. As a result, the power supply voltage $V_{CC}$ is applied from the power supply voltage output terminal 17 to the reset circuit 12. Note that a terminal 16 is a GND terminal.

The reset circuit 12 is constituted by resistors R11 ($=r_{11}$) and R12 ($=r_{12}$) and a capacitor C12 ($=c_{12}$). The reset circuit 12 outputs a reset signal to a reset input terminal 15 of the IC 11. When the power supply voltage $V_{CC}$ is to be applied from the power supply voltage output terminal 17 of the IC 11, since $r_{11} > r_{12}$, a voltage $V_{IN}$ of the reset input terminal 15 is given by $$V_{IN} = (r_{11}/(r_{11}+r_{12}))V_{CC} \simeq V_{CC}$$

and serves as a "High" logic-level input. As a result, the reset state is canceled.

An operation of the embodiment having the above-described arrangement will be described below.

When the switch S is closed while the reset input terminal 15 of the IC 11 is set in a state of voltage $V_{IN} = 0$, i.e., when the switch S is switched from an open state to a closed state (time t=0), the power supply voltage $V_{CC}$ is applied to the power supply voltage input terminal 14. This voltage is also applied to the FET 18.

Figure 2:
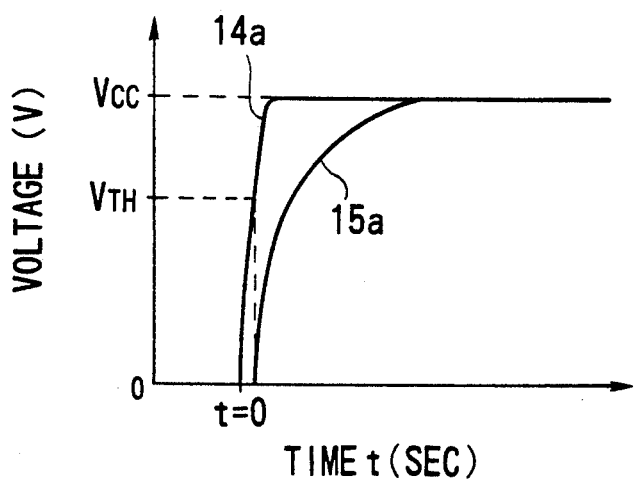
FIG. 2 is a graph showing changes in voltage at a power supply voltage input terminal and a reset input terminal upon closing of a switch in the embodiment.

FIG. 2 shows changes in terminal voltage upon closing of the switch S. The voltage $V_{CC}$ applied to the power supply voltage input terminal 14 exhibits changes indicated by a curve 14a. At the same time, the FET 18 is rendered conductive when the gate-source voltage $V_{GS}$ exceeds the threshold value $V_{TH}$. As a result, the power supply voltage $V_{CC}$ is output from the power supply voltage output terminal 17 to the reset circuit 12. In this case, the voltage $V_{IN}$ of the reset input terminal 15 is changed as indicated by a curve 15a in FIG. 2 in accordance with a time constant $\tau_{11} = r_{11} \cdot c_{12}$ because $r_{12} > r_{12}$.

If time t in FIG. 2 is sufficiently close to 0, the power supply voltage $V_{CC}$ is applied to the FET 18. At the same time, a "Low" logic-level signal having a voltage sufficiently close to 0 V is input to the reset input terminal 15. Therefore, the internal state of the IC 11 is reliably reset immediately after the switch S is closed to apply the power supply voltage. After the reset operation is completed, the reset is canceled. With this operation, initialization of the main circuit 10 of the IC 11 is completed. In other words, initialization of the main circuit 10 (or the IC 11) is completed only after the reset input terminal 15 undergoes a state change from "Low" level to "High" level (reset to reset cancellation) when the switch S is closed, i.e., a new battery is mounted. The reset circuit 12 is required to cause the above-mentioned state change.

Figure 3:
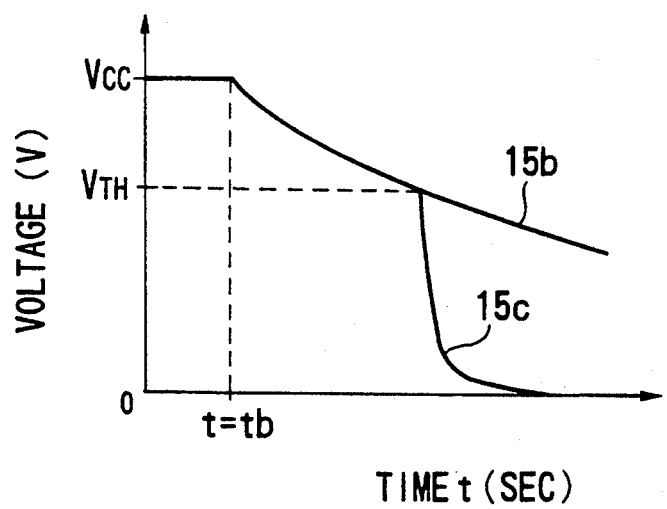
FIG. 3 is a graph showing changes in voltage at the power supply voltage input terminal and the reset input terminal upon opening of the switch.
Figure 4:
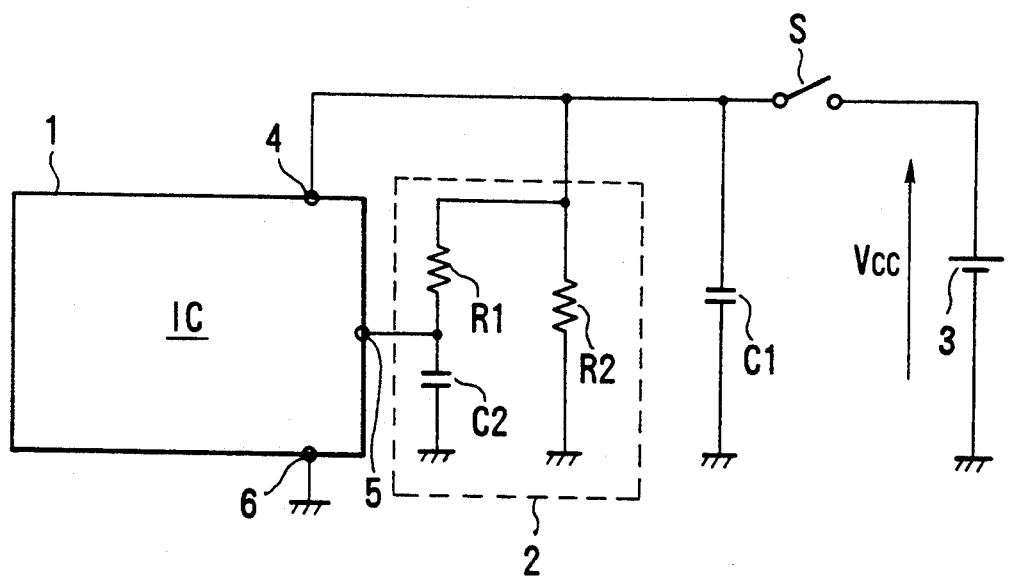
FIG. 4 is a circuit diagram showing a conventional power supply circuit having a reset circuit.
Figure 5:
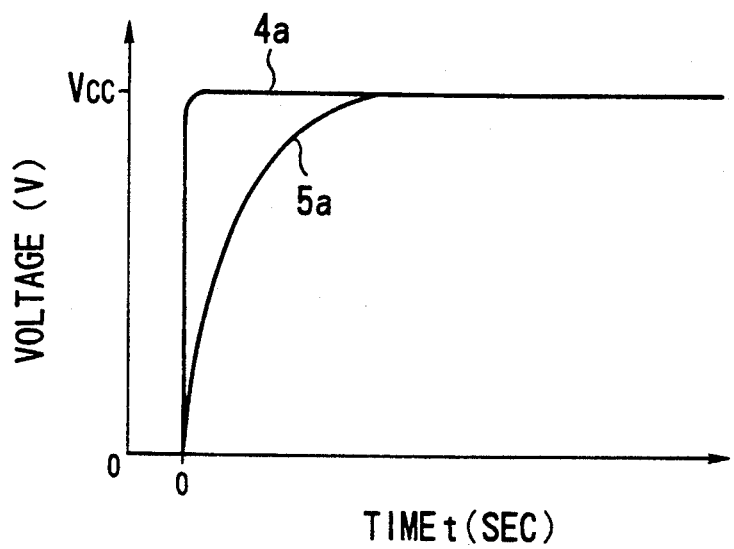
FIG. 5 is a graph showing changes in voltage at a power supply voltage input terminal and a reset input terminal upon closing of a switch in FIG. 4.
Figure 6:
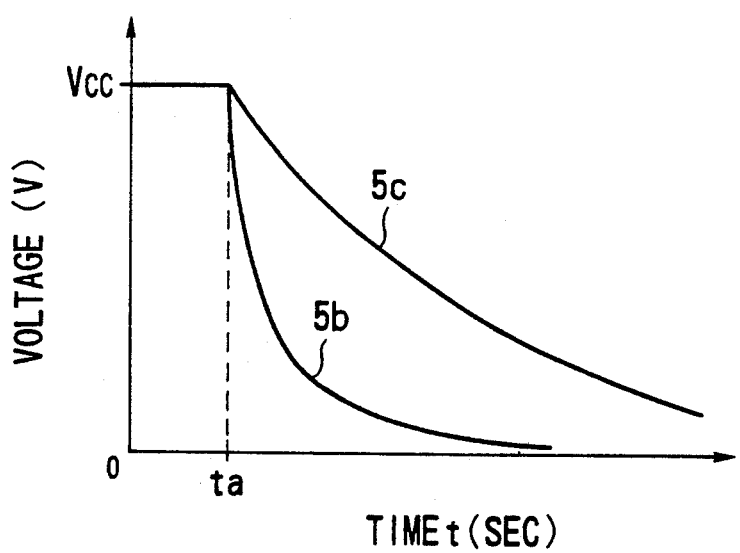
FIG. 6 is a graph showing changes in voltage at the power supply voltage input terminal and the reset input terminal upon opening of the switch in FIG. 4.

In contrast to this, when the switch S is opened ($t=t_b$), a voltage applied to the power supply voltage input terminal 14 is decreased as indicated by a curve 15b in FIG. 3. When the gate-source voltage $V_{GS}$ of the FET 18 becomes lower than the threshold value $V_{TH}$, the FET 18 is rendered nonconductive. At this time, since no power supply voltage $v_1$ is applied to the reset circuit 12, the reset input terminal voltage $V_{IN}$ has a time constant $\tau_{12} = r_{11} \cdot c_{12}$ and is quickly decreased, as indicated by a curve 15c.

As described above, in this embodiment, when the power supply voltage $v_1$ becomes equal to or lower than the threshold value $|V|$ of the FET 18, the reset input terminal voltage $V_{IN}$ is changed in accordance with the time constant $\tau_{12} = r_{11} \cdot c_{12}$ regardless of the capacitance of the capacitor C11 and a decreased state of the power supply voltage $v_1$. Since $c_{12} < c_{11}$, the time constant can be set to be sufficiently smaller than that in a conventional circuit by sufficiently decreasing the product of $r_{11}$ and $c_{12}$.

In addition, the level of the power supply voltage $v_1$ at which the reset input terminal voltage $V_{IN}$ begins to quickly drop corresponds to the threshold value $|V_{TH}|$. Therefore, if the overall IC 11 is constituted by MOSFETs each having substantially the same threshold voltage (absolute value) as that of the FET 18, the minimum operating voltage of the IC 11 becomes nearly equal to the threshold value $|V_{TH}|$.

That is, the instant at which the reset input terminal voltage $V_{IN}$ begins to rise from 0 V when the power supply is turned on corresponds to the instant at which the minimum operating voltage is applied to the IC 11. Therefore, the IC 11 can be reliably reset. In addition, even if the power supply voltage is decreased, when the power supply voltage applied to the IC 11 becomes lower than the minimum operating voltage, the reset input terminal voltage $V_{IN}$ is quickly decreased. Therefore, a reliable reset operation can be ensured even if variations in voltage in a decreased state occur upon opening/closing of the switch S or mounting/dismounting of the battery 3.

In the above-described embodiment, an FET is used as a switching circuit. Other types of transistors may be used. In addition, in an apparatus having a detachable power supply, such as a portable radio transceiver, a mounting/dismounting operation of the power supply can substitute for an ON/OFF operation of the above-described switch, as in the prior art.

As has been described above, according to the present invention, when supply of power is interrupted by the switching circuit, and a voltage applied to the main circuit becomes equal to or lower than a predetermined value, supply of power to the reset circuit is stopped. Therefore, a resettable state can be easily ensured within a short period of time regardless of a power supply stabilizing circuit. At the same, a reset operation can be reliably performed without being influenced by variations in change state of the power supply voltage.

What is claimed is:

1. A power supply circuit comprising:
   a power supply stabilizing circuit, receiving a power supply voltage from a power supply, for stabilizing the power supply voltage;
   a main circuit, receiving the power supply voltage without a substantial voltage drop, connected in parallel with the power supply stabilizing circuit;
   a reset circuit for outputting a reset signal to the main circuit when the power supply voltage rises; and
   reset circuit control means, receiving said power supply voltage for interrupting supply of power from the power supply to said reset circuit when the power supply voltage applied to said main circuit decreases to a value not more than a predetermined value after supply of power is interrupted.

2. A circuit according to claim 1, wherein said power supply stabilizing circuit includes a capacitor, and said reset circuit control means interrupts supply of power to said reset circuit when a voltage of said capacitor decreases a value not more than a predetermined value.

3. A circuit according to claim 1, wherein said reset circuit control means includes a field effect transistor which is connected to receive the power supply voltage and which operates to interrupt the supply of power to said reset circuit when the power supply voltage drops below the predetermined value.

4. A power supply circuit comprising:
   a main circuit, connected between an external power supply and a ground receiving a power supply voltage without a substantial voltage drop from the external power supply, the main circuit being initialized in response to a first signal changing from low-to high-level states;
   a power supply stabilizing circuit having a capacitor connected in parallel with a main circuit between the power supply and the ground and receiving the power supply voltage;
   a reset circuit having a first predetermined time constant for outputting said first signal to said main circuit when the stabilized power supply voltage rises; and
   reset circuit control means, connected to said power supply and receiving the power supply voltage, for interrupting supply of power from said power supply voltage to said reset circuit to produce said low-level state when the power supply voltage applied to said main circuit decreases to a value not more than a predetermined value when supply of power is interrupted.

5. A power supply circuit comprising:
   a power supply stabilizing circuit for stabilizing a power supply voltage from a power supply and applying the power supply voltage to a main circuit without a substantial voltage drop;
   a reset circuit supplied with said power supply voltage for outputting a reset signal to the main circuit when said power supply changes from a first level to a second level; and
   reset circuit control means, receiving said power supply voltage, for changing said power supply voltage to said reset circuit to said first level when the power supply voltage applied to said main circuit decreases to a predetermined value.

6. A circuit according to claim 5, wherein said first level < said second level.

7. A reset circuit comprising:
   an integrated circuit including:
     an external power supply input terminal,
     an external ground input terminal,
     an external reset input terminal,
     a main circuit connected between the external power supply input terminal and the external ground input terminal and being reset by an input received from the external reset input terminal,
     an external voltage output terminal,
     a transistor having a first terminal directly connected to the external power supply input terminal, a second terminal connected to the external voltage output terminal, and a control terminal coupled to a ground; and
   an external reset circuit, coupled to the integrated circuit, connected between the external voltage output terminal and the external reset input terminal, receiving a voltage supplied from the external power supply input terminal, and coupling the voltage received to the external reset input terminal.

8. The reset circuit as recited in claim 7 wherein the external reset circuit includes a resistor and capacitor, coupled to the external reset input terminal, causing a voltage at the external reset input to vary with a first time constant rate.

9. The reset circuit as recited in claim 8 including a capacitor, connected between the external power supply input terminal of the integrated circuit and the ground, causing a voltage at the external power supply input terminal to vary with a second time constant.

10. The reset circuit as recited in claim 9 wherein the second time constant is greater than the first time constant.

11. The power supply circuit as recited in claim 4 wherein the power supply voltage varies with the second predetermined time constant, the second predetermined time constant being greater than the first predetermined time constant.

12. The reset circuit as recited in claim 7 wherein the integrated circuit includes a plurality of metal oxide semiconductor field effect transistors MOSFETs forming the main circuit and the transistor, wherein each of the plurality of MOSFETs have a threshold voltage that is substantially the same, and wherein a minimum operating voltage of the integrated circuit is substantially the same as the threshold voltage, wherein the transistor is activated when a voltage, substantially equal to the threshold voltage, is applied to the external power supply input terminal.

* * * * *